(12) United States Patent
Kelekar et al.

(10) Patent No.: US 8,772,124 B2
(45) Date of Patent: Jul. 8, 2014

(54) FULL WAFER PROCESSING BY MULTIPLE PASSES THROUGH A COMBINATORIAL REACTOR

(71) Applicant: Intermolecular Inc., San Jose, CA (US)

(72) Inventors: Rajesh Kelekar, Los Altos, CA (US); Aaron T Francis, San Jose, CA (US); Gregory P Lim, Fremont, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 13/738,826

(22) Filed: Jan. 10, 2013

(65) Prior Publication Data

US 2013/0171802 A1 Jul. 4, 2013

Related U.S. Application Data

(62) Division of application No. 13/337,425, filed on Dec. 27, 2011.

(51) Int. Cl.
*H01L 21/76* (2006.01)

(52) U.S. Cl.
USPC .......................................................... 438/400

(58) Field of Classification Search
USPC .......................................................... 438/400
See application file for complete search history.

(56) References Cited

U.S. PATENT DOCUMENTS

2007/0202610 A1* 8/2007 Chiang et al. ................. 436/518

* cited by examiner

*Primary Examiner* — Marvin Payen

(57) ABSTRACT

Overlapping combinatorial processing can offer more processed regions, better particle performance and simpler process equipment. In overlapping combinatorial processing, one or more regions are processed in series with some degrees of overlapping between regions. In some embodiments, overlapping combinatorial processing can be used in conjunction with non-overlapping combinatorial processing and non-combinatorial processing to develop and investigate materials and processes for device processing and manufacturing.

6 Claims, 13 Drawing Sheets

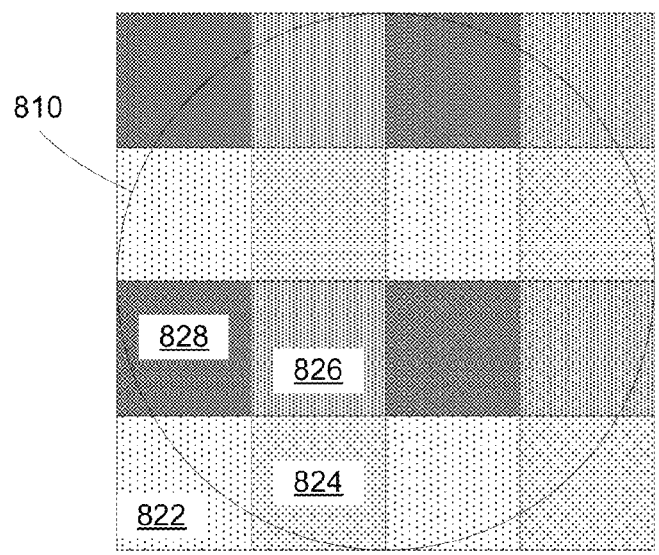
FIG. 8A
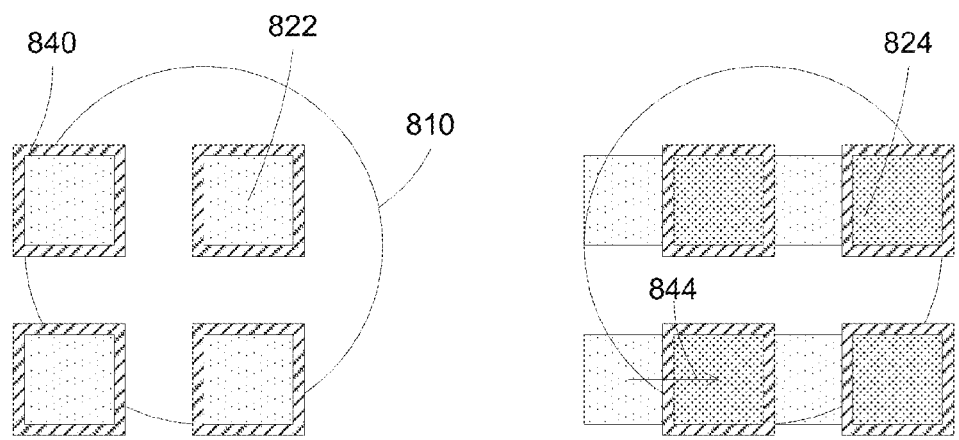
FIG. 8B          FIG. 8C
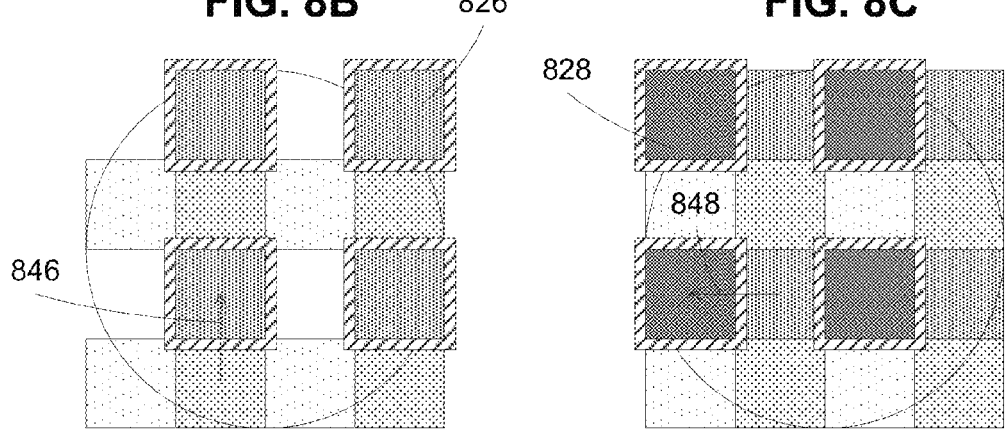
FIG. 8D          FIG. 8E

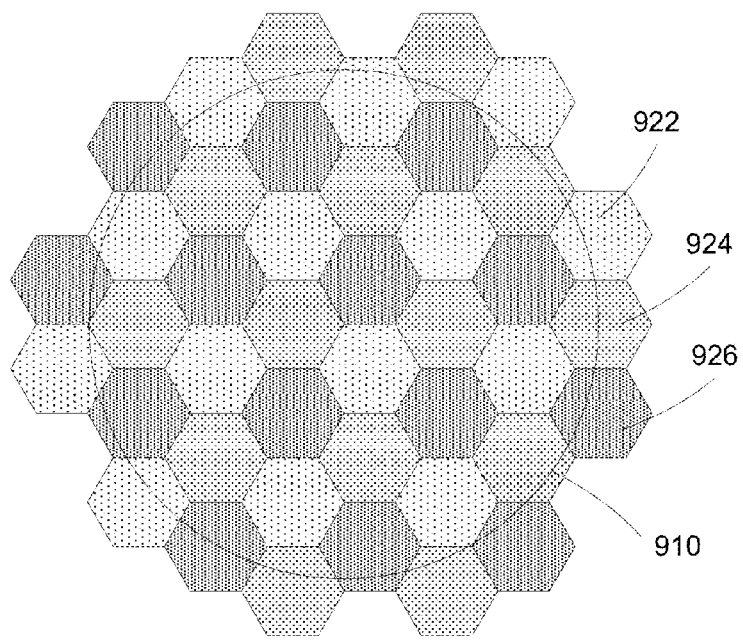
FIG. 9A
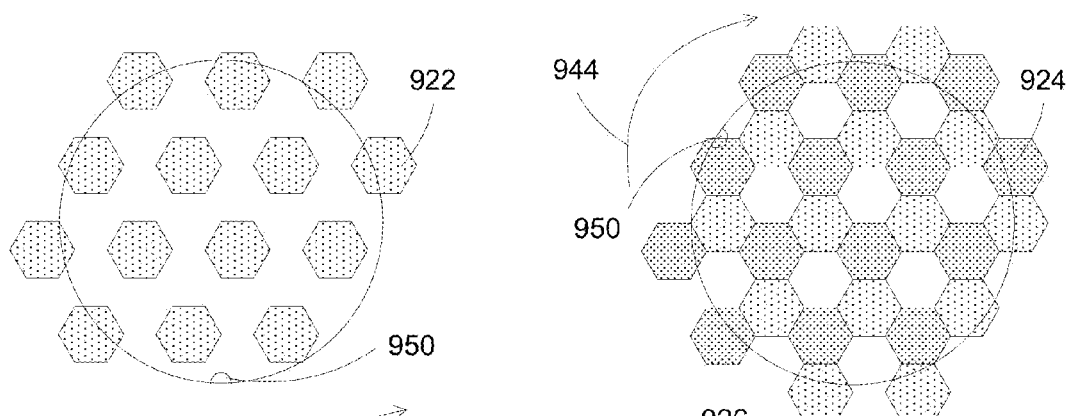
FIG. 9B
FIG. 9C
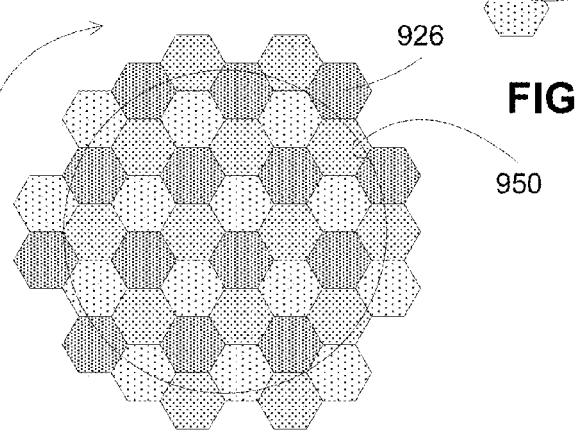
FIG. 9D

Processing a substrate through a conventional process, wherein the conventional process processes the whole substrate surface
1300

Processing the substrate through serial combinatorial processing steps, wherein the serial combinatorial processing steps serially process multiple site isolated regions of the substrate in a site overlapped manner
1310

FIG. 13

FULL WAFER PROCESSING BY MULTIPLE PASSES THROUGH A COMBINATORIAL REACTOR

CROSS-REFERENCE TO RELATED APPLICATIONS

This is a Divisional Application of U.S. patent application Ser. No. 13/337,425, filed on Dec. 27, 2011, which is herein incorporated by reference for all purposes.

FIELD OF THE INVENTION

The present invention relates generally to combinatorial methods for device process development.

BACKGROUND OF THE INVENTION

The manufacture of advanced semiconductor devices entails the integration and sequencing of many unit processing steps, with potential new material and process developments. The precise sequencing and integration of the unit processing steps enables the formation of functional devices meeting desired performance metrics such as power efficiency, signal propagation, and reliability.

As part of the discovery, optimization and qualification of each unit process, it is desirable to be able to i) test different materials, ii) test different processing conditions within each unit process module, iii) test different sequencing and integration of processing modules within an integrated processing tool, iv) test different sequencing of processing tools in executing different process sequence integration flows, and combinations thereof in the manufacture of devices such as integrated circuits. In particular, there is a need to be able to test i) more than one material, ii) more than one processing condition, iii) more than one sequence of processing conditions, iv) more than one process sequence integration flow, and combinations thereof, collectively known as "combinatorial process sequence integration", on a single monolithic substrate without the need of consuming the equivalent number of monolithic substrates per material(s), processing condition(s), sequence(s) of processing conditions, sequence(s) of processes, and combinations thereof. This can greatly improve both the speed and reduce the costs associated with the discovery, implementation, optimization, and qualification of material(s), process(es), and process integration sequence(s) required for manufacturing.

Systems and methods for High Productivity Combinatorial (HPC) processing are described in U.S. Pat. No. 7,544,574 filed on Feb. 10, 2006, U.S. Pat. No. 7,824,935 filed on Jul. 2, 2008, U.S. Pat. No. 7,871,928 filed on May 4, 2009, U.S. Pat. No. 7,902,063 filed on Feb. 10, 2006, and U.S. Pat. No. 7,947,531 filed on Aug. 28, 2009 which are all herein incorporated by reference. Systems and methods for HPC processing are further described in U.S. patent application Ser. No. 11/352,077 filed on Feb. 10, 2006, claiming priority from Oct. 15, 2005, U.S. patent application Ser. No. 11/419,174 filed on May 18, 2006, claiming priority from Oct. 15, 2005, U.S. patent application Ser. No. 11/674,132 filed on Feb. 12, 2007, claiming priority from Oct. 15, 2005, and U.S. patent application Ser. No. 11/674,137 filed on Feb. 12, 2007, claiming priority from Oct. 15, 2005 which are all herein incorporated by reference.

HPC processing techniques have been used in wet chemical processing such as etching and cleaning. HPC processing techniques have also been used in deposition processes such as physical vapor deposition (PVD), atomic layer deposition (ALD), and chemical vapor deposition (CVD).

In standard HPC systems, multiple site isolated regions on a substrate surface can be formed by sealing different regions of the surface, isolating the surface regions from each other. The substrate surface regions between the site isolated regions are not utilized but can still require processing such as cleaning or stripping. For example, existing combinatorial or site-isolated processing can leave ~60% of the substrate unprocessed, which can prevent a substrate from being analyzed on some metrology tools or reinserted into a fabrication facility or production line. Therefore there is a need for processing all surface regions of a substrate surface.

SUMMARY OF THE DESCRIPTION

The invention discloses methods for processing multiple site isolated regions through a combinatorial reactor. Complete substrate coverage or overlapping processing can be achieved in a step and repeat pattern.

In some embodiments, the present invention discloses methods and systems for processing a substrate through multiple combinatorial processing steps, wherein the combinatorial processing steps sequentially process multiple regions of the substrate in a site overlapped manner. For example, in a first combinatorial processing step, a first region of a substrate is processed, for example, by depositing, etching, cleaning or patterning. In a second combinatorial processing step, sequentially executed after the first step, a second region of the substrate, adjacent to or overlapping the first region, is processed.

The process parameters for some regions can be the same, resulting in the overlapped area experienced processes of two regions. The process parameters for some regions can be varied in a combinatorial manner, resulting in an array of differentially processed regions on a substrate.

In some embodiments, the present overlapping combinatorial process can cover the whole substrate, thus offering more process area and more process regions. With process overlap capability, the substrate surface can be fully utilized, for example, by eliminating non-processed areas between regions. With more surface area on the substrate used for processing, more combinatorial variation can be processed on the substrate, resulting in faster throughput and more cost effective development.

In some embodiments, the present invention discloses a combination of overlapping and non-overlapping combinatorial processing steps, comprising combinatorially processing one or more regions of the substrate in a parallel manner together with combinatorially processing multiple regions of the substrate in a sequentially overlapped manner. The parallel processing of the one or more regions can be performed in a site isolated manner, and the sequential processing of the multiple regions can be performed in a site overlapped manner, where at least one region of the multiple regions overlaps at least one other region of the multiple regions.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which:

FIGS. 8A-8E illustrate an exemplary step-and-repeat combinatorial processing using a square pattern according to some embodiments of the present invention.

FIGS. 9A-9D illustrate an exemplary step-and-repeat combinatorial processing using a hexagonal pattern according to some embodiments of the present invention.

FIG. 13 illustrates an exemplary method according to some embodiments of the present invention.

DETAILED DESCRIPTION

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

The present invention relates to systems and methods for multiple high productivity combinatorial processing steps, in which combinatorial processing steps sequentially process multiple regions of the substrate in a site overlapped manner. In some embodiments, the overlapping combinatorial process can cover the whole substrate, thus offering more process area and more process regions. In some embodiments, the overlapping combinatorial process can offer additional combinatorial processed regions, for example, two overlapped site isolated regions can offer three regions with different processes.

"Combinatorial Processing" generally refers to techniques of differentially processing multiple regions of one or more substrates. Combinatorial processing generally varies materials, unit processes or process sequences across multiple regions on a substrate. The varied materials, unit processes, or process sequences can be evaluated (e.g., characterized) to determine whether further evaluation of certain process sequences is warranted or whether a particular solution is suitable for production or high volume manufacturing.

Figure 1:
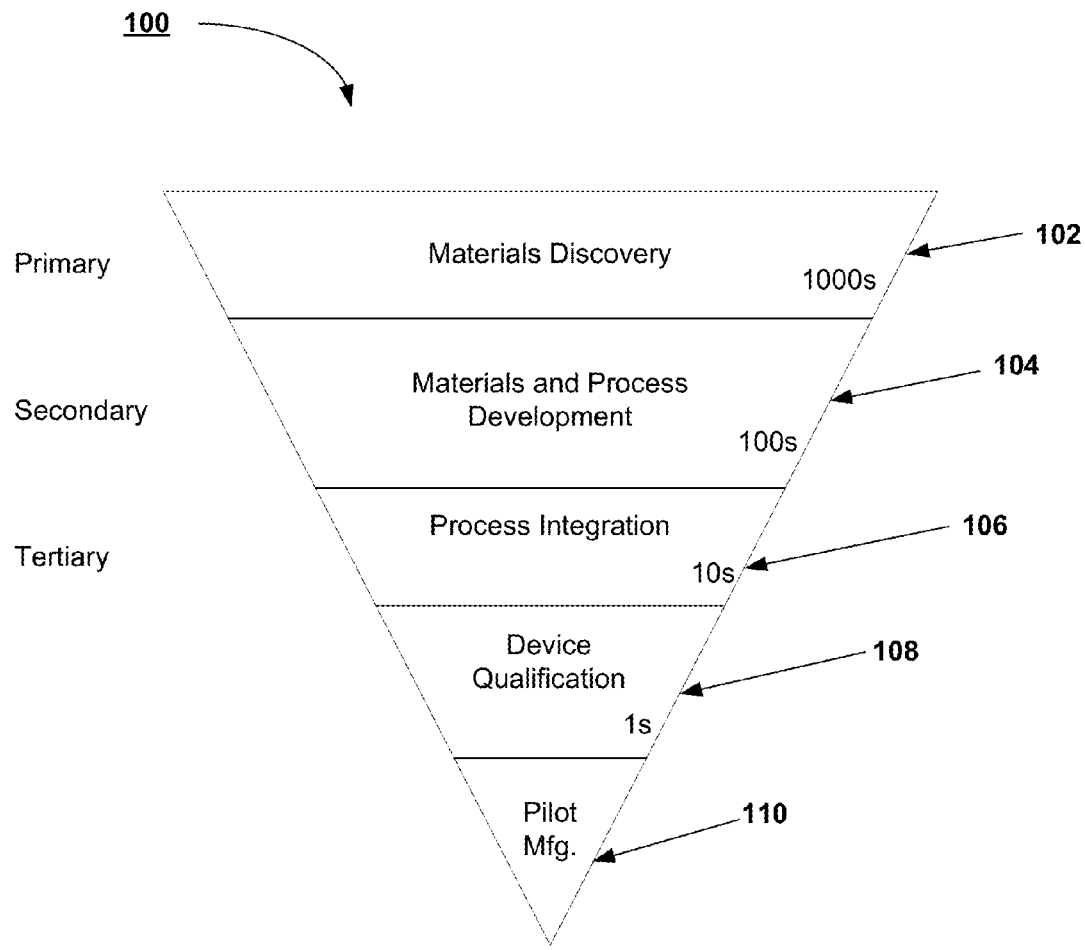
FIG. 1 illustrates a schematic diagram for implementing combinatorial processing and evaluation using primary, secondary, and tertiary screening.

FIG. 1 illustrates a schematic diagram, 100, for implementing combinatorial processing and evaluation using primary, secondary, and tertiary screening. The schematic diagram, 100, illustrates that the relative number of combinatorial processes run with a group of substrates decreases as certain materials and/or processes are selected. Generally, combinatorial processing includes performing a large number of processes during a primary screen, selecting promising candidates from those processes, performing the selected processing during a secondary screen, selecting promising candidates from the secondary screen for a tertiary screen, and so on. In addition, feedback from later stages to earlier stages can be used to refine the success criteria and provide better screening results.

For example, thousands of materials are evaluated during a materials discovery stage, 102. Materials discovery stage, 102, is also known as a primary screening stage performed using primary screening techniques. Primary screening techniques may include dividing substrates into coupons and depositing materials using varied processes. The materials are then evaluated, and promising candidates are advanced to the secondary screen, or materials and process development stage, 104. Evaluation of the materials is performed using metrology tools such as electronic testers and imaging tools (i.e., microscopes).

The materials and process development stage, 104, may evaluate hundreds of materials (i.e., a magnitude smaller than the primary stage) and may focus on the processes used to deposit or develop those materials. Promising materials and processes are again selected, and advanced to the tertiary screen or process integration stage, 106, where tens of materials and/or processes and combinations are evaluated. The tertiary screen or process integration stage, 106, may focus on integrating the selected processes and materials with other processes and materials.

The most promising materials and processes from the tertiary screen are advanced to device qualification, 108. In device qualification, the materials and processes selected are evaluated for high volume manufacturing, which normally is conducted on full substrates within production tools, but need not be conducted in such a manner. The results are evaluated to determine the efficacy of the selected materials and processes. If successful, the use of the screened materials and processes can proceed to pilot manufacturing, 110.

The schematic diagram, 100, is an example of various techniques that may be used to evaluate and select materials and processes for the development of new materials and processes. The descriptions of primary, secondary, etc. screening and the various stages, 102-110, are arbitrary and the stages may overlap, occur out of sequence, be described and be performed in many other ways.

This application benefits from High Productivity Combinatorial (HPC) techniques described in U.S. patent application Ser. No. 11/674,137 filed on Feb. 12, 2007 which is hereby incorporated for reference in its entirety. Portions of the '137 application have been reproduced below to enhance the understanding of the present invention. The embodiments described herein enable the application of combinatorial techniques to process sequence integration in order to arrive at a globally optimal sequence of device fabrication processes by considering interaction effects between the unit manufacturing operations, the process conditions used to effect such unit manufacturing operations, hardware details used during the processing, as well as materials characteristics of components utilized within the unit manufacturing operations. Rather than only considering a series of local optimums, i.e., where the best conditions and materials for each manufacturing unit operation is considered in isolation, the embodiments described below consider interactions effects introduced due to the multitude of processing operations that are performed and the order in which such multitude of processing operations are performed. A global optimum sequence order is therefore derived, and as part of this derivation, the unit processes, unit process parameters and materials used in the unit process operations of the optimum sequence order are also considered.

The embodiments described further analyze a portion or sub-set of the overall process sequence used to manufacture a semiconductor device. Once the subset of the process sequence is identified for analysis, combinatorial process sequence integration testing is performed to optimize the materials, unit processes, hardware details, and process sequence used to build that portion of the device or structure. During the processing of some embodiments described herein, structures are formed on the processed substrate which are equivalent to the structures formed during actual production of the device. For example, such structures may include, but would not be limited to, gate dielectric layers, gate electrode layers, spacers, or any other series of layers or unit processes that create an intermediate structure found on semiconductor devices. While the combinatorial processing varies certain materials, unit processes, hardware details, or process sequences, the composition or thickness of the layers or structures or the action of the unit process, such as cleaning, surface preparation, deposition, surface treatment, etc. is substantially uniform through each discrete region. Furthermore, while different materials or unit processes may be used for corresponding layers or steps in the formation of a structure in different regions of the substrate during the combinatorial processing, the application of each layer or use of a given unit process is substantially consistent or uniform throughout the different regions in which it is intentionally applied. Thus, the processing is uniform within a region (inter-region uniformity) and between regions (intra-region uniformity), as desired. It should be noted that the process can be varied between regions, for example, where a thickness of a layer is varied or a material may be varied between the regions, etc., as desired by the design of the experiment.

The result is a series of regions on the substrate that contain structures or unit process sequences that have been uniformly applied within that region and, as applicable, across different regions. This process uniformity allows comparison of the properties within and across the different regions such that the variations in test results are due to the varied parameter (e.g., materials, unit processes, unit process parameters, hardware details, or process sequences) and not the lack of process uniformity. In the embodiments described herein, the positions of the discrete regions on the substrate can be defined as needed, but are preferably systematized for ease of tooling and design of experimentation. In addition, the number, variants and location of structures within each region are designed to enable valid statistical analysis of the test results within each region and across regions to be performed.

Figure 2:
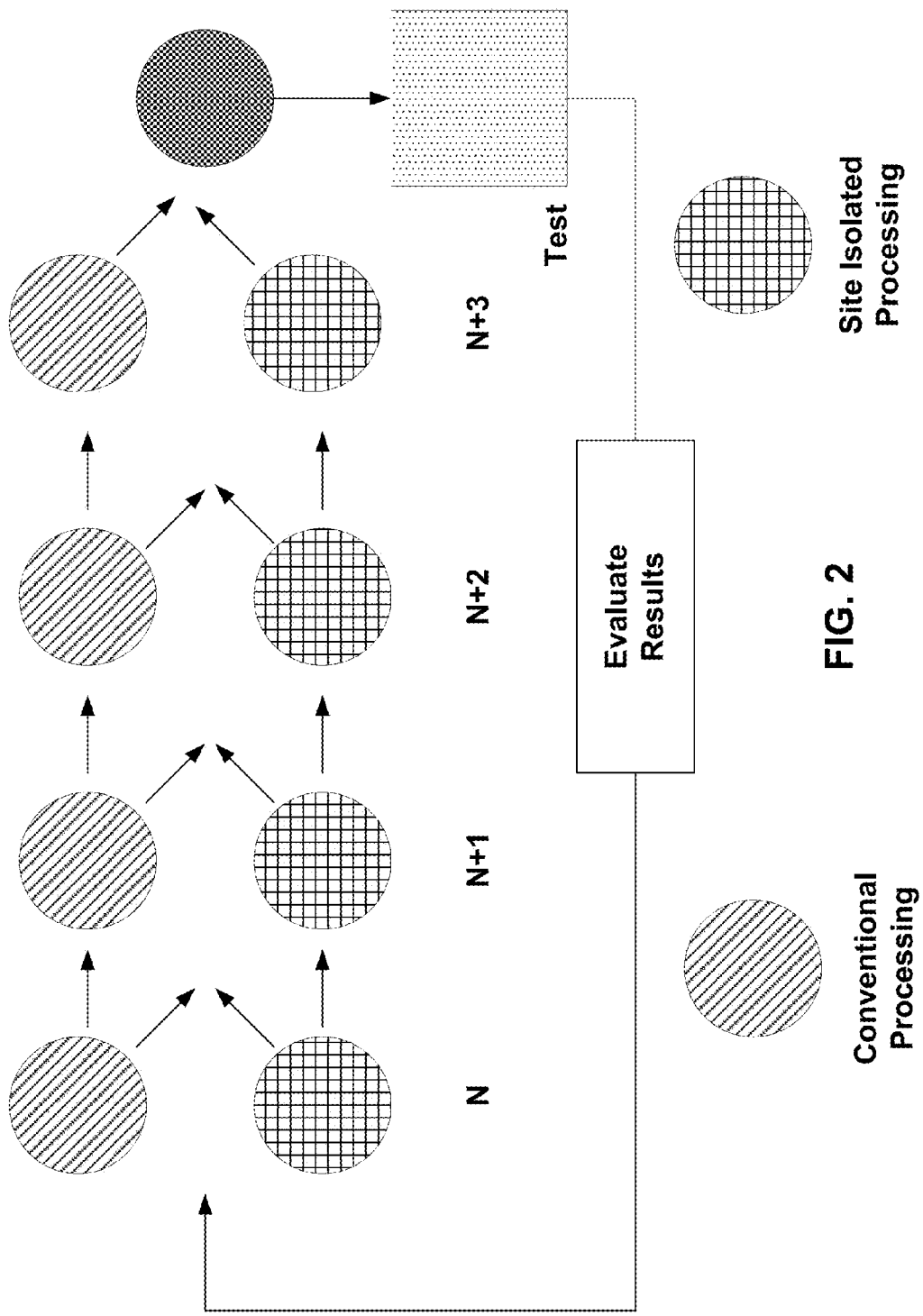
FIG. 2 is a simplified schematic diagram illustrating a general methodology for combinatorial process sequence integration that includes site isolated processing and/or conventional processing in accordance with one embodiment of the invention.

FIG. 2 is a simplified schematic diagram illustrating a general methodology for combinatorial process sequence integration that includes site isolated processing and/or conventional processing in accordance with one embodiment of the invention. In one embodiment, the substrate is initially processed using conventional process N. In one exemplary embodiment, the substrate is then processed using site isolated process N+1. During site isolated processing, an HPC module may be used, such as the HPC module described in U.S. patent application Ser. No. 11/352,077 filed on Feb. 10, 2006. The substrate can then be processed using site isolated process N+2, and thereafter processed using conventional process N+3. Testing is performed and the results are evaluated. The testing can include physical, chemical, acoustic, magnetic, electrical, optical, etc. tests. From this evaluation, a particular process from the various site isolated processes (e.g. from steps N+1 and N+2) may be selected and fixed so that additional combinatorial process sequence integration may be performed using site isolated processing for either process N or N+3. For example, a next process sequence can include processing the substrate using site isolated process N, conventional processing for processes N+1, N+2, and N+3, with testing performed thereafter.

It should be appreciated that various other combinations of conventional and combinatorial processes can be included in the processing sequence with regard to FIG. 2. That is, the combinatorial process sequence integration can be applied to any desired segments and/or portions of an overall process flow. Characterization, including physical, chemical, acoustic, magnetic, electrical, optical, etc. testing, can be performed after each process operation, and/or series of process operations within the process flow as desired. The feedback provided by the testing is used to select certain materials, processes, process conditions, and process sequences and eliminate others. Furthermore, the above flows can be applied to entire monolithic substrates, or portions of monolithic substrates such as coupons.

Under combinatorial processing operations the processing conditions at different regions can be controlled independently. Consequently, process material amounts, reactant species, processing temperatures, processing times, processing pressures, processing flow rates, processing powers, processing reagent compositions, the rates at which the reactions are quenched, deposition order of process materials, process sequence steps, hardware details, etc., can be varied from region to region on the substrate. Thus, for example, when exploring materials, a processing material delivered to a first and second region can be the same or different. If the processing material delivered to the first region is the same as the processing material delivered to the second region, this processing material can be offered to the first and second regions on the substrate at different concentrations. In addition, the material can be deposited under different processing parameters. Parameters which can be varied include, but are not limited to, process material amounts, reactant species, processing temperatures, processing times, processing pressures, processing flow rates, processing powers, processing reagent compositions, the rates at which the reactions are quenched, atmospheres in which the processes are conducted, an order in which materials are deposited, hardware details of the gas distribution assembly, etc. It should be appreciated that these process parameters are exemplary and not meant to be an exhaustive list as other process parameters commonly used in semiconductor manufacturing may be varied.

As mentioned above, within a region, the process conditions are substantially uniform, in contrast to gradient processing techniques which rely on the inherent non-uniformity of the material deposition. That is, the embodiments, described herein locally perform the processing in a conventional manner, e.g., substantially consistent and substantially uniform, while globally over the substrate, the materials, processes, and process sequences may vary. Thus, the testing will find optimums without interference from process variation differences between processes that are meant to be the same. It should be appreciated that a region may be adjacent to another region in one embodiment or the regions may be isolated and, therefore, non-overlapping. When the regions are adjacent, there may be a slight overlap wherein the materials or precise process interactions are not known, however, a portion of the regions, normally at least 50% or more of the area, is uniform and all testing occurs within that region. Further, the potential overlap is only allowed with material of processes that will not adversely affect the result of the tests. Both types of regions are referred to herein as regions or discrete regions.

Combinatorial processing can be used to produce and evaluate different materials, chemicals, processes, process and integration sequences, and techniques related to semiconductor fabrication. For example, combinatorial processing can be used to determine optimal processing parameters (e.g., power, time, reactant flow rates, temperature, etc.) of dry processing techniques such as dry etching (e.g., plasma etching, flux-based etching, reactive ion etching (RIE)) and dry deposition techniques (e.g., physical vapor deposition (PVD), chemical vapor deposition (CVD), atomic layer deposition (ALD), etc.). Combinatorial processing can be used to determine optimal processing parameters (e.g., time, concentration, temperature, stirring rate, etc.) of wet processing techniques such as wet etching, wet cleaning, rinsing, and wet deposition techniques (e.g., electroplating, electroless deposition, chemical bath deposition, etc.).

Figure 3:
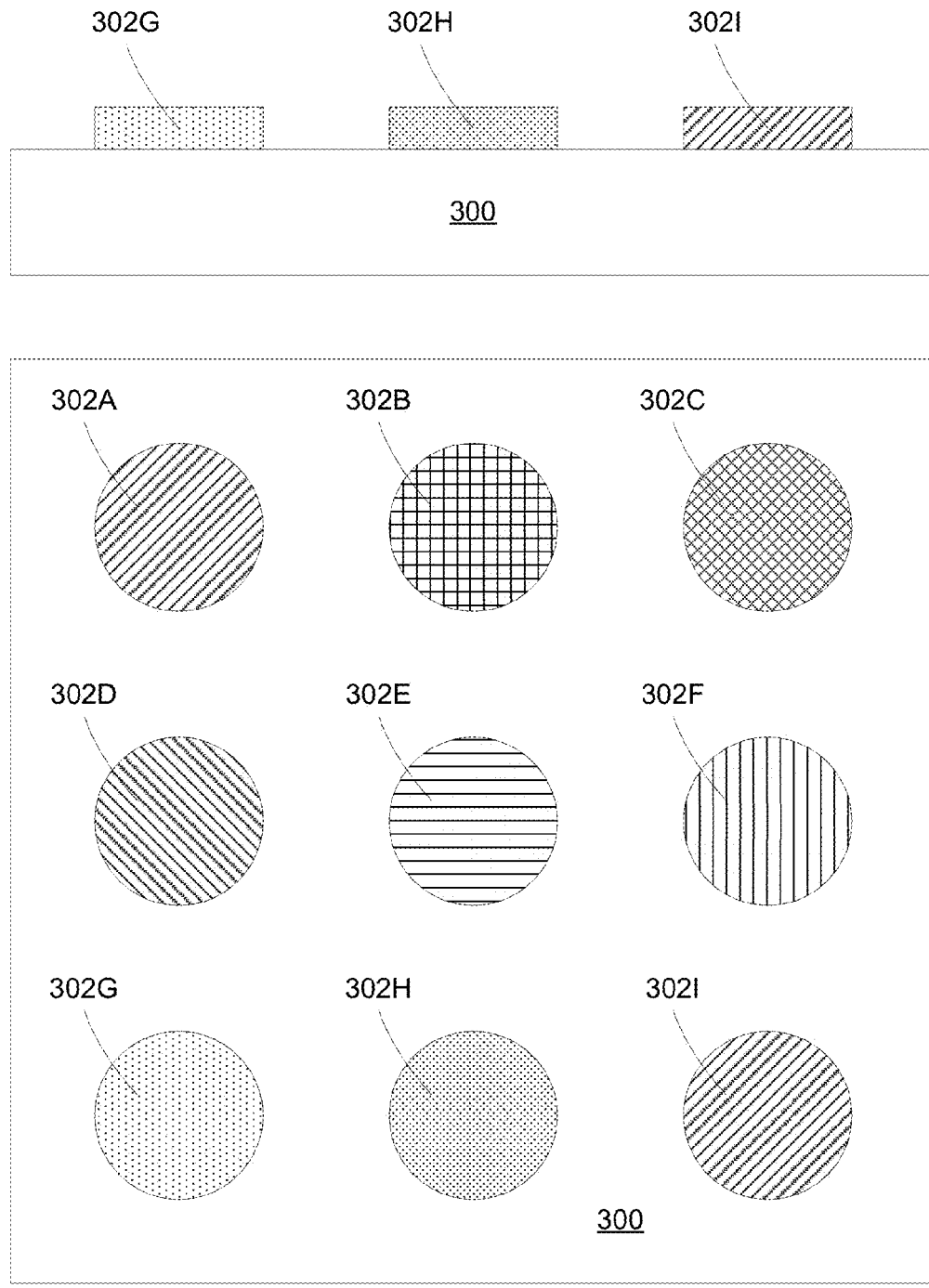
FIG. 3 illustrates a schematic diagram of a substrate that has been processed in a combinatorial manner.

FIG. 3 illustrates a schematic diagram of a substrate that has been processed in a combinatorial manner. A substrate, 300, is shown with nine site isolated regions, 302A-302I, illustrated thereon. Although the substrate 300 is illustrated as being a generally square shape, those skilled in the art will understand that the substrate may be any useful shape such as round, rectangular, etc. The lower portion of FIG. 3 illustrates a top down view while the upper portion of FIG. 3 illustrates a cross-sectional view taken through the three site isolated regions, 302G-302I. The shading of the nine site isolated regions illustrates that the process parameters used to process these regions have been varied in a combinatorial manner. The substrate may then be processed through a next step that may be conventional or may also be a combinatorial step as discussed earlier with respect to FIG. 2.

Figure 4:
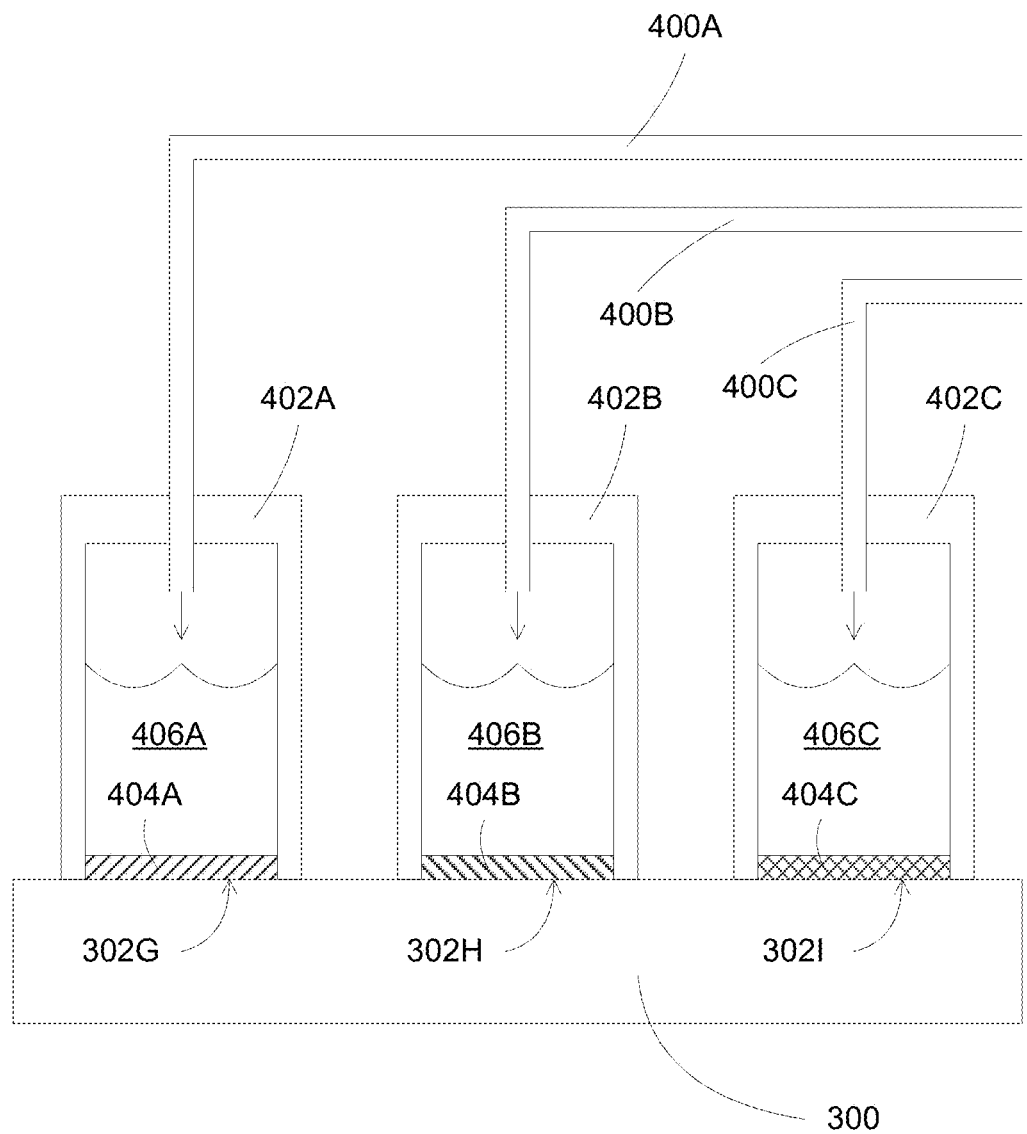
FIG. 4 illustrates a schematic diagram of a combinatorial wet processing system according to an embodiment described herein.

FIG. 4 illustrates a schematic diagram of a combinatorial wet processing system according to some embodiments described herein. A combinatorial wet system may be used to investigate materials deposited by solution-based techniques. An example of a combinatorial wet system is described in U.S. Pat. No. 7,544,574 cited earlier. Those skilled in the art will realize that this is only one possible configuration of a combinatorial wet system. FIG. 4 illustrates a cross-sectional view of substrate, 300, taken through the three site isolated regions, 302G-302I similar to the upper portion of FIG. 3. Solution dispensing nozzles, 400a-400c, supply different solution chemistries, 406A-406C, to chemical processing cells, 402A-402C. FIG. 4 illustrates the deposition of a layer, 404A-404C, on respective site isolated regions. Although FIG. 4 illustrates a deposition step, other solution-based processes such as cleaning, etching, surface treatment, surface functionalization, etc. may be investigated in a combinatorial manner. Advantageously, the solution-based treatment can be customized for each of the site isolated regions.

In some embodiments, the present invention discloses methods and systems for processing a substrate through multiple combinatorial processing steps, wherein the combinatorial processing steps sequentially process multiple regions of the substrate in an overlapped manner. For example, in a first combinatorial processing step, a first region of a substrate, defined by a first site isolated reactor, is processed, for example, by depositing, etching, cleaning or patterning. In a second combinatorial processing step, sequentially executed after the first step, a second region of the substrate, contiguous (e.g., adjacent or overlapping) to the first region, is processed. The second region of the substrate is also defined by a second site isolated reactor. The first region and the second region may overlap or may be adjacent to one another. Since the reactors have side walls with finite thickness, the first and second regions are typically processed at different times.

In some embodiments, the present invention discloses methods and systems for combinatorial processing of multiple overlapping regions of a substrate. The process parameters used to process the multiple overlapping regions, such as variations of materials, unit processes, and process sequences, can be varied in a combinatorial manner. The present combinatorial processing can provide a simple and cost effective screening of semiconductor manufacturing operations to derive optimum manufacturing methods or integration sequences. In the present description, the term "overlapping regions" or "contiguous regions" also includes adjacent or overlapping process regions on the substrate, which is a result of substrate processing using overlapping reactors.

Figure 5A:
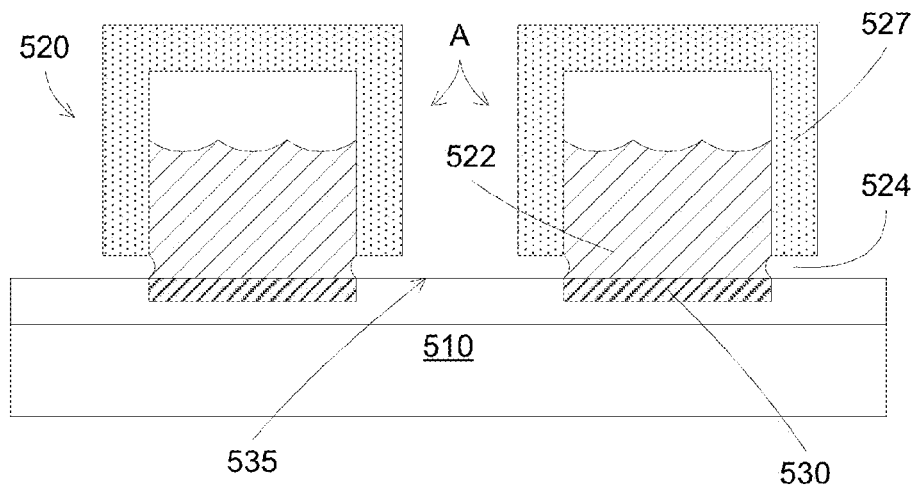
FIGS. 5A-5C illustrate an exemplary overlapping process according to some embodiments of the present invention.
Figure 5B:
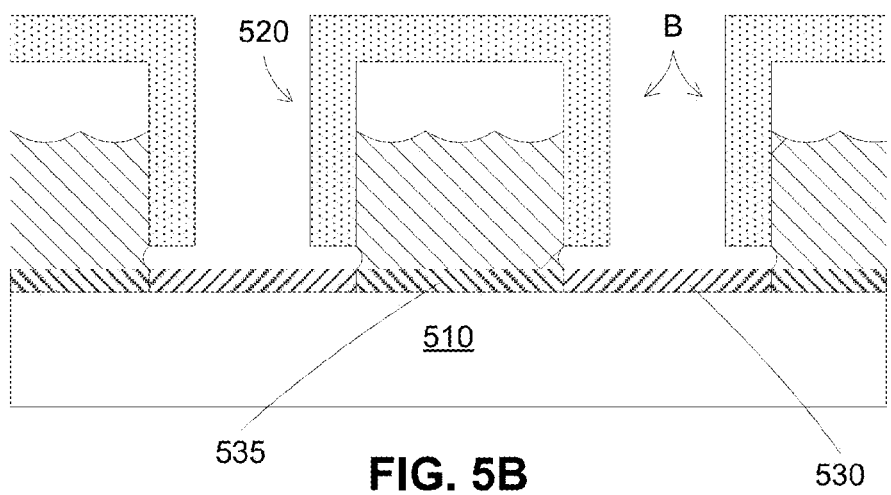
Figure 5C:
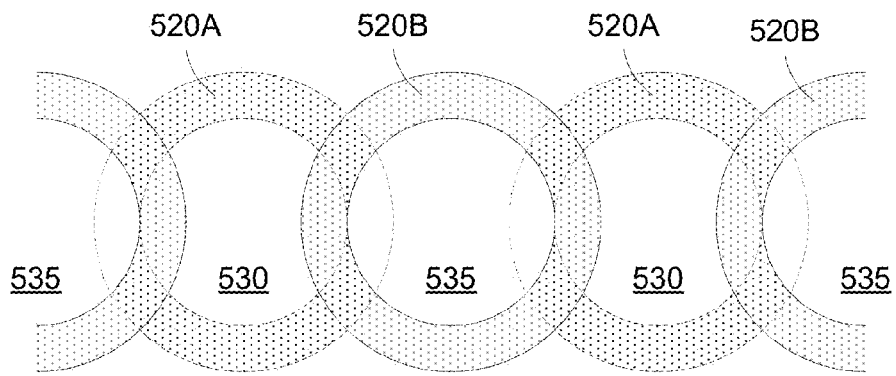

FIGS. 5A-5C illustrate an exemplary overlapping process according to some embodiments of the present invention. In FIG. 5A, a first combinatorial process A is performed on substrate 510, comprising one or more site isolated reactors 520 disposed on a substrate 510 for processing one or more site isolated surface regions 530. The site isolated surface regions 530 are separated from each other, for example, by surface regions 535. As shown, the reactors are wet process reactors, comprising processing liquid 522 constrained within the interior volume of the reactors 520. The reactors 520 have walls 527 with finite thickness, which form a seal 524 with the substrate surface to isolate the liquid 522. The seal 524 can be a contact seal, such as an o-ring, or can be a non-contact seal, such as an air bearing.

In some embodiments, the present invention utilizes reactors which can form an effective seal between the sleeve or cell walls and the substrate surface without physically contacting the surface. One method for forming the "touchless" or "no-contact" seal would be to use a gas bearing. A gas bearing is typically used for frictionless motion of stages and other mechanisms, but the inherent floating or levitating characteristics would also be effective at preventing a reactor, process cells, isolation cell, sleeves, etc, from contacting a wafer surface. The low fly height (typically 5-20 microns) would also form an effective barrier against fluid intrusion. The gas bearing could be a nozzle type, with one or more discrete ports to supply the suspension air or gas. It could also be the porous media type, with multiple microscopic holes distributing the suspension air or gas more evenly. Porous elements can be used to form non-contact reactor cell, as disclosed in co-pending patent application "TOUCHLESS SITE ISOLATION USING GAS BEARING", application Ser. No. 13/337,374, hereby incorporated by reference. Because the suspension gas escapes at the bearing edges, a containment or vent ring can be used to prevent bubbling, foaming, or otherwise entraining gas into the fluid. The non-contact protected surface regions can allow the exclusion of certain surface areas on the substrate from being similarly processed by the fluid without any potential damage caused by added particles.

In FIG. 5B, a second combinatorial process B is sequentially performed on substrate 510, after the first combinatorial process A. The site isolated reactors in both combinatorial processes A and B can be the same or different reactors. For example, for same reactor configuration, the site isolated reactors 520 are moved relative to the substrate 510 to be positioned on adjacent site isolated surface regions 535. As shown, the site isolated surface regions 535 are next to the site isolated surface regions 530, allowing coverage of the whole surface of the substrate. Since the site isolated reactors 520 have walls 527 of finite thickness, surface regions 535 and 530 cannot be processed at a same time, but instead, can be sequentially processed through multiple passes.

FIG. 5C illustrates the overlapping configuration of the reactors, showing reactors 520 in both first A and second B combinatorial processes, where reactors 520 in first combinatorial process A are labeled 520A and reactors 520 in second combinatorial process B are labeled 520B. The reactors 520A and 520B overlap in positions at different times, meaning that these reactors 520A and 520B cannot be used at the same time. The site isolated regions 530 and 535 are shown to be contiguous, e.g., they are adjacent to each other with at least a common boundary point. Alternatively, the regions 530 and 535 can be adjacent to each other without sharing boundary points, e.g., the regions 530 and 535 can be separated by less than twice the thickness of the reactors 520.

Figure 6A:
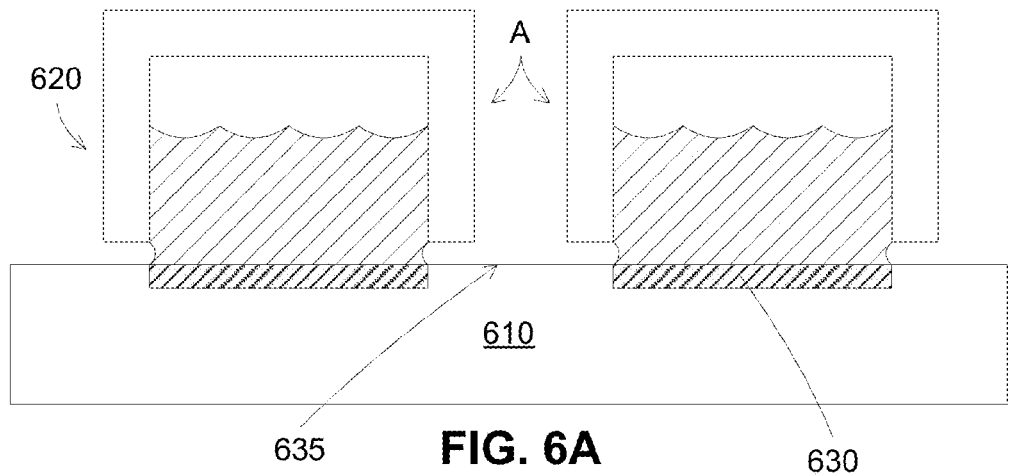
FIGS. 6A-6C illustrate another exemplary overlapping process according to some embodiments of the present invention.
Figure 6B:
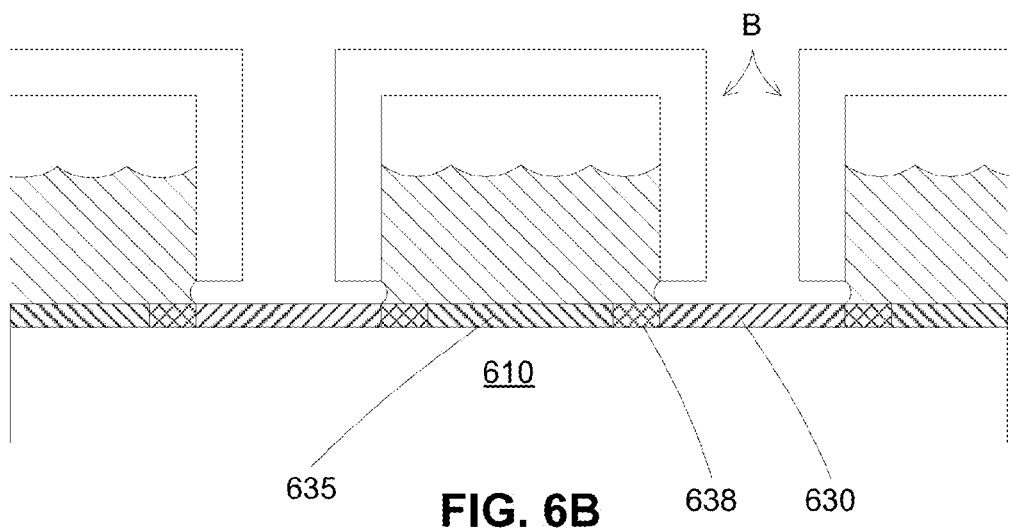
Figure 6C:
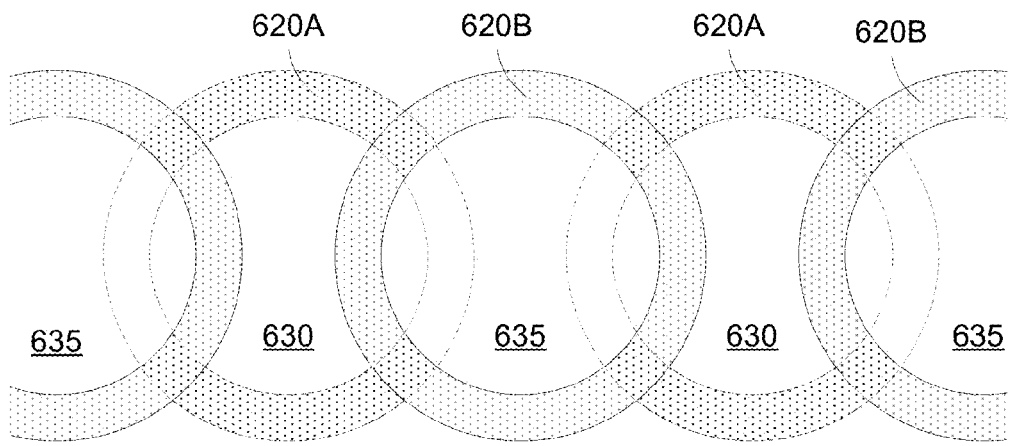

FIGS. 6A-6C illustrate another exemplary overlapping process according to some embodiments of the present invention. In FIG. 6A, a first combinatorial process A is performed on substrate 610, comprising one or more site isolated reactors 620 disposed on a substrate 610 for processing one or more site isolated surface regions 630. The site isolated surface regions 630 are separated from each other, for example, by surface regions 635. In FIG. 6B, a second combinatorial process B is sequentially performed on substrate 610, after the first combinatorial process. The site isolated reactors 620 are moved relative to the substrate 610 to be positioned on site isolated surface regions 635, which overlap the site isolated surface regions 630. The overlapped regions 638 are processed in both first and second combinatorial processes.

FIG. 6C illustrates the overlapping configuration of the reactors, showing reactors 620 in both first A and second B combinatorial processes, where reactors 620 in first combinatorial process A are labeled 620A and reactors 620 in second combinatorial process B are labeled 620B. The site isolated regions 630 and 635 overlap to form common process regions 638.

In some embodiments, the site isolated regions are at least contiguous, including adjacent to each other with shared border (as shown in FIG. 5C), or overlapping each other with shared processed regions (e.g., regions 638, as shown in FIG. 6C).

Figure 7A:
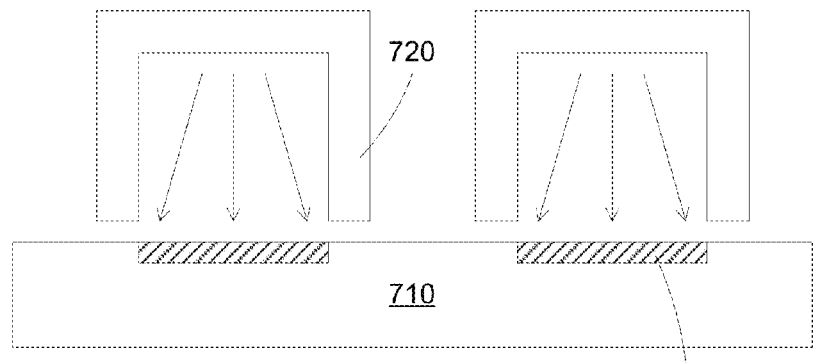
FIG. 7A-7C illustrate another exemplary overlapping process according to some embodiments of the present invention.
Figure 7B:
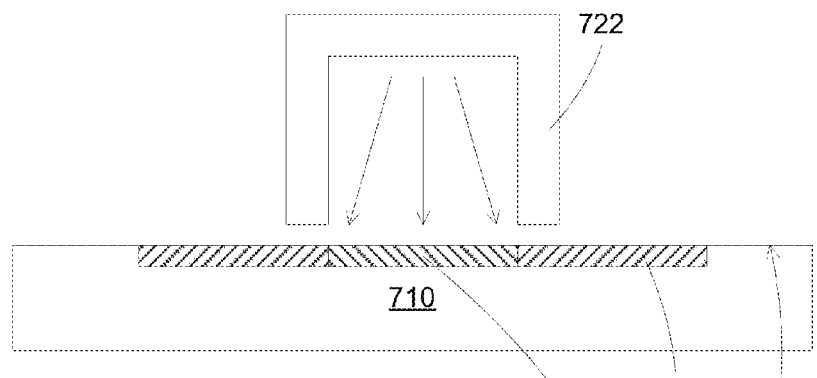
Figure 7C:
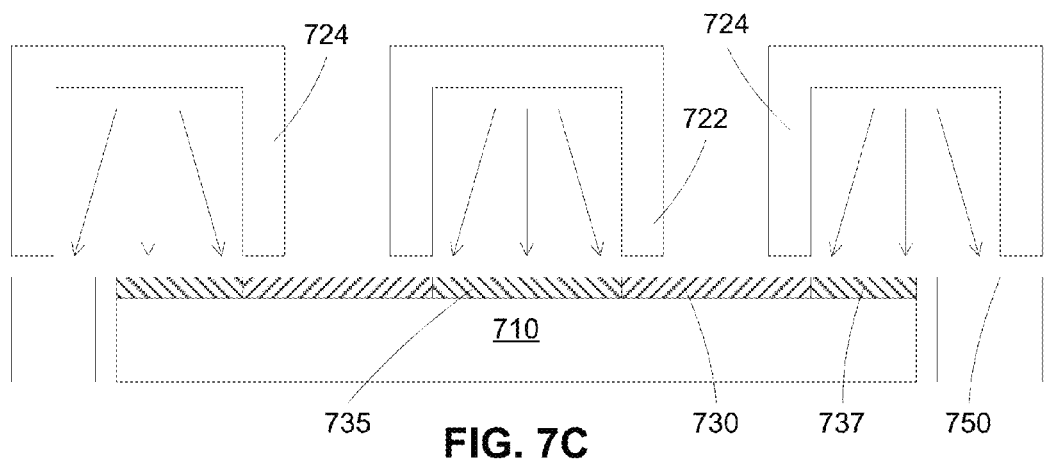

In some embodiments, the overlapping combinatorial process can process a surface region covering a portion of the substrate edge. FIG. 7A-7C illustrate another exemplary overlapping process according to some embodiments of the present invention. In FIG. 7A, a first combinatorial process is performed on substrate 710, using site isolated processing using a vapor phase technique, such as chemical vapor deposition or atomic layer deposition. Site isolated reactors 720 can process site isolated regions 730 on substrate 710. In FIG. 7B, a second combinatorial process is performed on substrate 710 with the substrate edges excluded from being processed. In the second combinatorial process, surface regions 735 between the site isolated regions 730 are processed by reactors 722, while edge regions 740 are excluded.

Alternatively, in FIG. 7C, a different second combinatorial process can be performed on substrate 710 with the substrate edges also being processed. In addition to the surface regions 735 between the site isolated regions 730 processed by reactors 722, edge regions 737 are also processed by reactors 724. Special consideration can be used for substrate edge processing, for example, using extended substrate edge support 750.

In some embodiments, a step-and-repeat method can be used to achieve complete substrate coverage using a plurality of individual cells. This could be achieved using a rectangular pattern or a polar pattern. This method can be used to process the entire wafer, with cells or regions overlapping the edges, or the used to process the center regions only with some exclusion area near the edges of the substrate. The non-processed edge region could be subsequently processed (cleaned, stripped, etc.) using a full substrate technique (e.g., processing the whole substrate) or an edge processing technique, e.g., by applying a chemistry near the edge. Alternatively, the edge region can also be combinatorial processed with special considerations.

In some embodiments, contact site isolation techniques (using a PTFE sleeve, o-ring sleeve, etc. to form a seal) or touchless or no-contact site isolation techniques (using an air bearing to form a seal) can be used. For example, the touchless site isolation method may include, but is not limited to, inverted reactor, vortex pad (i.e. Bernoulli chuck), nozzle-type air bearing, porous media air bearing, or other gas barrier system.

In some embodiments, the multiple combinatorial processing method is preferably employed with a touchless site isolation method. Touchless site isolation processing can provide more complete and efficient use of the substrate area available and could eliminate the secondary process needed for reinsertion compatibility or capability.

FIGS. 8A-8E illustrate an exemplary step-and-repeat combinatorial processing using a square pattern according to some embodiments of the present invention. As shown in FIG. 8A, a substrate 810 can be completely processed through four combinatorial process steps, processing site isolated regions 822-828 in sequence. In FIG. 8B, in a first combinatorial processing step, site isolated reactors 840 can process site isolated regions 822 on substrate 810. Special consideration can be used for processing substrate regions comprising an edge portion, such as using substrate support or reactor support for allow edge processing, or using reactors that do not require complete reactor coverage. In FIG. 8C, a second combinatorial processing step is performed to process site isolated regions 824. For example, the reactors can be translated in a horizontal direction 844 to process surface regions 824 adjacent to surface regions 822. Alternatively, the reactors can be stationary with the substrate 810 translated in an opposite direction. In FIG. 8D, a third combinatorial processing step is performed to process site isolated regions 826, with the reactors translated in a vertical direction 846. In FIG. 8E, a fourth combinatorial processing step is performed to process site isolated regions 828, with the reactors translated in a horizontal direction 848.

The site isolated regions 822-828 are not overlapped but disposed next to each other, which together, completely cover the whole substrate. However, due to the wall thickness, the site isolated regions 822-828 must be processed by reactors 840 at different times.

In some embodiments, a hexagonal ("hex") pattern can be used for the step-and-repeat combinatorial processing. Using hex patterns, it is possible to cover the entire area of interest with only three repeats. For example, the repeats could include translational movements in a Cartesian coordinate, which would require X-Y motion of the substrate support and/or reactors. Alternatively, the step-and-repeat can include rotational movements in a polar coordinate. In the rotational step-and-repeat process, the substrate can be loaded in a first configuration for the first combinatorial process step, then transferred to a cleaning chamber for rinse and dry. The substrate is then returned to the process chamber with a different configuration (such as rotated by 120 deg), for example, using a prealigner for rotation. The combinatorial process can be repeated as many times as necessary, though 3 cycles (0, 120, 240 degree rotation) will provide complete coverage with proper cell overlap.

FIGS. 9A-9D illustrate an exemplary step-and-repeat combinatorial processing using a hexagonal pattern according to some embodiments of the present invention. As shown in FIG. 9A, a substrate 910 can be completely processed through four combinatorial process steps, processing site isolated regions 922-926 in sequence. In FIG. 9B, in a first combinatorial processing step, site isolated regions 922 are processed on substrate 910. Notch 950 can be used to identify the alignment of the substrate 910 in this step. In FIG. 9C, a second combinatorial processing step is performed to process site isolated regions 924. For example, the substrate can be rotated in a clockwise direction 944 to process surface regions 924 adjacent to surface regions 922. The angle of rotation can be determined by the notch 950, for example, by rotating 120 degrees from the first combinatorial processing step. Alternatively, the substrate can be stationary with the reactors rotated in an opposite direction. In FIG. 9D, a third combinatorial processing step is performed to process site isolated regions 926, with the substrate rotated in a clockwise direction 946, for example, another 120 degrees from the second combinatorial processing step.

Figure 10:
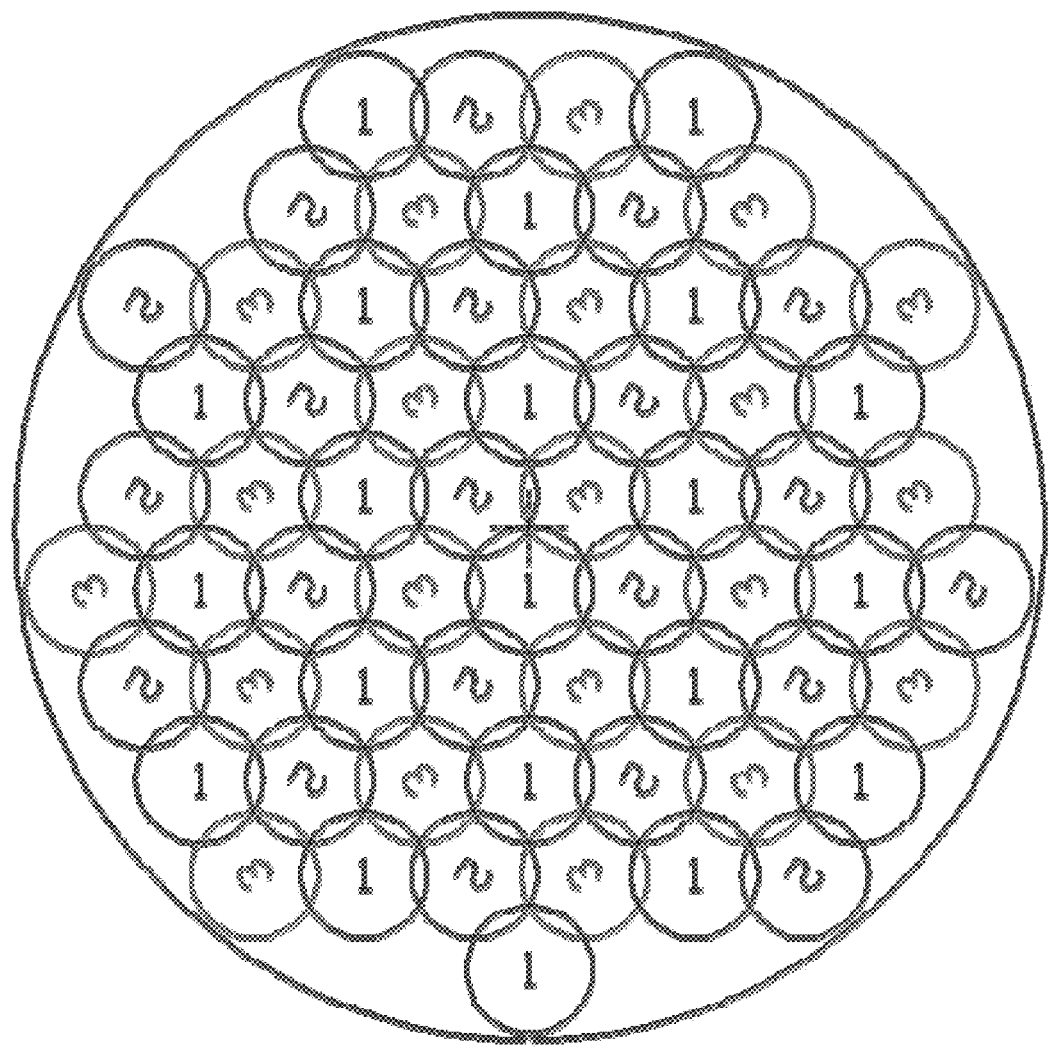
FIG. 10 illustrates an exemplary step-and-repeat combinatorial processing using a circular pattern according to some embodiments of the present invention.

FIG. 10 illustrates an exemplary step-and-repeat combinatorial processing using a circular pattern according to some embodiments of the present invention. Circular site isolated regions can be sequentially processed to cover the substrate surface. For example, in a first combinatorial processing step, site isolated regions 1 are processed. Afterward, the reactors are rotated 120 degrees with respect to the center of the substrate, and site isolated regions 2 are processed. The reactors are further rotated another 120 degrees to process site isolated regions 3. For circular patterns, the processed regions can be overlapped, resulting in overlapping regions between regions 1 and 2, overlapping regions between regions 2 and 3, and overlapping regions between regions 1 and 3.

In some embodiments, the process parameters for the regions can be the same, resulting in the overlapped area experienced the same processes twice. The process parameters for the regions can be varied in a combinatorial manner, resulting in an array of differentially processed regions on a substrate.

In some embodiments, the present overlapping combinatorial process can offer more discretely processing regions as compared to non-overlapping combinatory processes using similar combinatorial processing steps. For example, for two combinatorial processing steps, the overlapping combinatorial process can generate three distinct regions having different process conditions: a non-overlapped first region, a non-overlapped second region, and an overlapped region of the first and second regions.

Figure 11A:
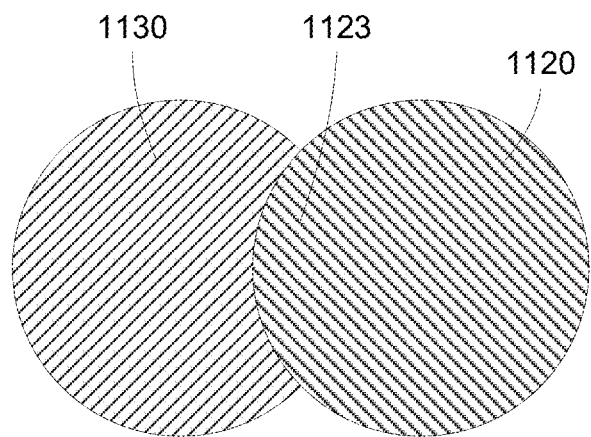
FIGS. 11A-11B illustrate exemplary overlapping configurations according to some embodiments of the present invention.
Figure 11B:
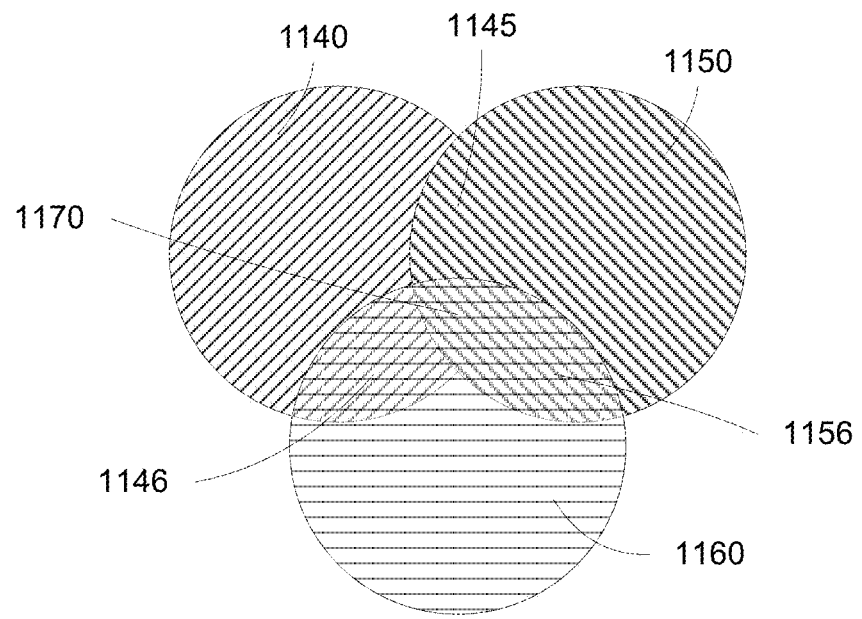

FIGS. 11A-11B illustrate exemplary overlapping configurations according to some embodiments of the present invention. In FIG. 11A, first and second combinatorial processing steps can process overlapped first and second site isolated regions 1120 and 1130, respectively. The overlapped region 1123 has experienced both processes of regions 1120 and 1130. For example, an electroplating process of 2 and 4 seconds for regions 1120 and 1130, respectively, can result in an electroplating process of 6 seconds for the overlapped region 1123. Thus overlapping combinatorial processing steps can generate site isolated regions, such as region 1123, from the overlapped site isolated regions, such as regions 1120 and 1130 that have experienced a combination of processes of the overlapped regions.

In FIG. 11B, first, second and third combinatorial processing steps can process overlapped first, second and third site isolated regions 1140, 1150 and 1160, respectively. The overlapped regions 1145, 1146 and 1156 have experienced both processes of regions 1140/1150, 1140/1160 and 1150/1160, respectively. In addition, the overlapped region 1170 has experienced all processes of regions 1140, 1150 and 1160. Other overlapping configurations can also be used, such as the overlapping configuration shown in FIG. 10.

In some embodiments, the present overlapping combinatorial process can fill the whole substrate, thus offering more process area and more process regions. With process overlap capability, the substrate surface can be fully utilized, for example, by eliminating non-processed areas between regions. With more surface area on the substrate used for processing, more combinatorial variation can be processed on the substrate, resulting in faster throughput and more cost effective developments.

In some embodiments, the present overlapping combinatorial process can minimize particulate contamination, for example, particles caused by non-processing regions. Better particle performance characteristics can be achieved since the overlapping process regions allow for more uniform and thorough rinsing of substrate surface, as compared to cleaning of non-process regions.

In some embodiments, the present overlapping combinatorial process can utilize simpler process equipment, for example, using only reactor assemblies to process multiple surface regions. The complementary assemblies for processing, cleaning or rinsing of the non-processed regions, e.g., the regions between processed regions, can be eliminated, since all surface areas are processed regions.

Figure 12:
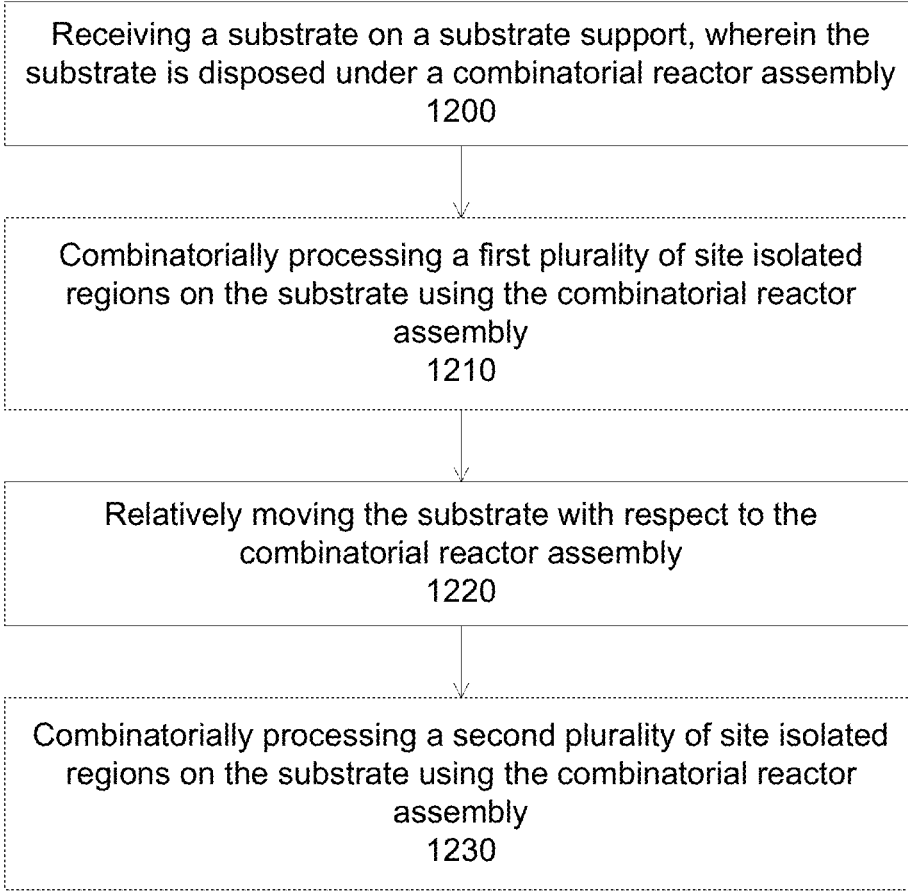
FIG. 12 illustrates an exemplary flowchart for combinatorially processing a substrate according to some embodiments of the present invention.

FIG. 12 illustrates an exemplary flowchart for combinatorially processing a substrate according to some embodiments of the present invention. Operation 1200 receives a substrate on a substrate support, wherein the substrate is disposed under a combinatorial reactor assembly. Operation 1210 combinatorially processes a first plurality of site isolated regions on the substrate using the combinatorial reactor assembly. Operation 1220 relatively moves the substrate with respect to the combinatorial reactor assembly. Operation 1230 combinatorially processes a second plurality of site isolated regions on the substrate using the combinatorial reactor assembly.

In some embodiments, the present invention discloses an overlapping combinatorial process where multiple combinatorial processing steps are executed in series. In an exemplary method, a combinatorial processing chamber is provided, wherein the combinatorial processing chamber comprises a substrate support and a combinatorial reactor assembly, wherein the substrate support is disposed under the combinatorial reactor assembly. The substrate support is configured to receive a substrate and can be coupled to a movement mechanism for rotating, horizontally translating or up/down movements. The combinatorial reactor assembly comprises a plurality of site isolated reactors, configuring to process multiple site isolated regions on the substrate. The plurality of site isolated reactors is disposed adjacent to each other within the combinatorial reactor assembly, with or without gaps in between the reactors. However, since the reactors all have finite thickness walls, the multiple site isolated regions on the substrate, processed by the site isolated reactors, are separated from each other, with a finite gap in between the site isolated regions. For example, if the site isolated reactors are disposed next to each other without any gap, the site isolated regions on the substrate are separated by a distance equaled to twice the wall thickness of the site isolated reactors.

A substrate is introduced to the substrate support, for example, from a loading station, and through a robotic transfer mechanism. The substrate support can be raised up, to be coupled with the reactors of the combinatorial reactor assembly. In some embodiments, the reactors make contact with the substrate for sealing the individual site isolated regions on the substrate. In some embodiments, the reactors form non-contact seals with the substrate, for example, by gas bearing isolation.

A first plurality of site isolated regions on the substrate is combinatorially processed using the combinatorial reactor assembly. The combinatorial processing technique can be used to develop and investigate materials and processes for device processing and manufacturing. For example, in the combinatorial process, process parameters used to process the one or more regions are varied in a combinatorial manner. Alternatively, at least one region of the one or more regions is processed differently from at least one other region of the one or more regions. For example, different processing times can be used for different site isolated regions.

After completed processing, the substrate is lowered to be separated from the combinatorial reactor assembly, and then moved relative to the combinatorial reactor assembly. For example, the substrate or the substrate support can be rotated or translated while the combinatorial reactor assembly is stationary, so that the reactors are positioned at different regions on the substrate surface. Alternatively, the combinatorial reactor assembly can be rotated or translated while the substrate is stationary. In some embodiments, the substrate is moved so that the reactors can be positioned at second substrate surface regions between the first already-processed substrate surface regions.

The reactors in the combinatorial reactor assembly can be configured so that the second regions are adjacent or overlapping the first regions. For example, if the reactors are spaced apart, the second regions can be adjacent to the first regions. If the reactors are closer to each other, the second regions can overlap the first regions.

In some embodiments, the substrate can be cleaned after the first combinatorial process before subjected to the movement. For example, a water rinsing step followed by a spin drying step can be performed before rotating or translating the substrate. The water rinsing and spin drying can be performed in the same combinatorial process chamber, or can be performed in a separate chamber. For example, after completed the combinatorial process, the substrate is transferred to a cleaning chamber for rinsing and drying. Afterward, the substrate can be transferred to a aligner to be rotated, for example, 120 degrees for a three combinatorial process sequence. The rotated substrate is then transferred back to the combinatorial process chamber for the next combinatorial process.

A second plurality of site isolated regions on the substrate is combinatorially processed on the moved substrate using the combinatorial reactor assembly. The processing can be repeated, for example, until the whole substrate is completed processed.

For example, using a hexagonal pattern with substrate rotation processing, a sequence of three combinatorial processes can be performed. For example, after processing the first and second pluralities of site isolated regions, the method further comprises relatively moving the substrate with respect to the combinatorial reactor assembly; and combinatorially processing a third plurality of site isolated regions on the substrate. The first, second and third pluralities of site isolated regions completely cover the substrate surface.

In some embodiments, a sequence of four combinatorial processes can be performed. For example, after processing the first, second and third pluralities of site isolated regions, the method further comprises relatively moving the substrate with respect to the combinatorial reactor assembly; and combinatorially processing a fourth plurality of site isolated regions on the substrate. The first, second, third and fourth pluralities of site isolated regions completely cover the substrate surface.

In some embodiments, the method further comprises cleaning the substrate after combinatorially processing the first plurality of site isolated regions. In some embodiments, the substrate is rotated with respect to the combinatorial reactor assembly, for example, the substrate can be rotated, or the combinatorial reactor assembly can be rotated. In some embodiments, the substrate or the substrate support can be translated with respect to the combinatorial reactor assembly, for example, the substrate or the substrate support can be translated, or the combinatorial reactor assembly can be translated.

In some embodiments, at least one site isolated region of the first plurality of site isolated regions overlaps at least one site isolated region of the second plurality of site isolated regions. Alternatively, at least one site isolated region of the first plurality of site isolated regions is adjacent to at least one site isolated region of the second plurality of site isolated regions. In some embodiments, the process parameters used to process the plurality of site isolated regions on the substrate are varied in a combinatorial manner. The site isolated regions comprise a hexagonal pattern.

In some embodiments, the present invention discloses an overlapping combinatorial process where multiple combinatorial processing steps are executed in series. An exemplary method comprises processing a substrate through a sequence of multiple combinatorial processing steps, wherein each combinatorial processing step processes the substrate in multiple site isolated regions, and wherein the multiple combinatorial processing steps sequentially process multiple site isolated regions of the substrate in a site overlapped manner. Another exemplary method comprises processing a substrate through multiple processing steps in a sequential manner; wherein each processing step processes multiple site isolated regions in a combinatorial manner; wherein the site isolated regions of a processing step are at least contiguous with the site isolated regions another processing step.

The multiple combinatorial processing steps process the whole substrate. The multiple site isolated regions in a first combinatorial processing step are adjacent to the multiple site isolated regions in a second combinatorial processing step. The multiple site isolated regions in a first combinatorial processing step overlap the multiple site isolated regions in a second combinatorial processing step.

In some embodiments, the present invention discloses a combination of conventional and combinatorial site isolated processing techniques wherein the combinatorial processing steps sequentially process multiple regions of the substrate in a site overlapped manner. For example, a same process to be performed on all regions of the substrate can be executed in a conventional, e.g., non combinatorial, processing technique for the whole substrate. Overlapping and non-overlapping combinatory processing can be included.

In some embodiments, the present invention discloses a combination of non-combinatorial and multiple combinatorial processes where the multiple combinatorial processing steps are executed in series. FIG. 13 illustrates an exemplary method according to some embodiments of the present invention. Operation 1300 processes a substrate through a conventional process, wherein the conventional process processes the whole substrate surface. Operation 1310 processes the substrate through sequential combinatorial processing steps, wherein the sequential combinatorial processing steps sequentially process multiple site isolated regions of the substrate in a site overlapped manner. The sequential combinatorial processing steps can completely process the substrate surface.

Another exemplary method comprises processing a substrate through multiple processing steps in a sequential manner; wherein one or more processing step processes the substrate in a conventional manner; wherein one or more processing step processes multiple site isolated regions in a combinatorial manner; wherein the site isolated regions of a processing step are at least contiguous with the site isolated regions another processing step Although the foregoing examples have been described in some detail for purposes of clarity of understanding, the invention is not limited to the details provided. There are many alternative ways of implementing the invention. The disclosed examples are illustrative and not restrictive.

What is claimed is:

1. A method comprising:
processing a substrate through multiple processing steps in sequential manner;
wherein each processing step processes a plurality of site isolated regions on a surface of the substrate in a combinatorial manner; and
wherein there is no overlap between the site isolated regions processed in a first processing step and there is significant overlap between the site isolated regions processed in a second processing step and the site isolated regions processed in the first processing step.

2. The method of claim 1 further comprising
rotating the substrate between at least two processing steps of the multiple processing steps.

3. The method of claim 1 further comprising
translating the substrate between at least two processing steps of the multiple processing steps.

4. The method of claim 1 wherein the substrate is disposed under a reactor assembly, the method further comprising
rotating the reactor assembly between at least two processing steps of the multiple processing steps.

5. The method of claim 1 wherein the substrate is disposed under a reactor assembly, the method further comprising
translating the reactor assembly between at least two processing steps of the multiple processing steps.

6. The method of claim 1 wherein the plurality of site isolated regions each comprise a circular shape.

* * * * *